United States Patent
Shimbayashi

(10) Patent No.: US 7,605,616 B2
(45) Date of Patent: Oct. 20, 2009

(54) VOLTAGE DETECTOR CIRCUIT

(75) Inventor: Koji Shimbayashi, Aichi-Ken (JP)

(73) Assignee: Spansion LLC, Sunnyvale, CA (US)

( * ) Notice: Subject to any disclaimer, the term of this patent is extended or adjusted under 35 U.S.C. 154(b) by 206 days.

(21) Appl. No.: 11/975,097

(22) Filed: Oct. 16, 2007

(65) Prior Publication Data

US 2008/0094052 A1    Apr. 24, 2008

Related U.S. Application Data

(63) Continuation-in-part of application No. PCT/JP2006/320696, filed on Oct. 18, 2006.

(51) Int. Cl.
H03K 5/153    (2006.01)

(52) U.S. Cl. .......................... 327/77; 327/81

(58) Field of Classification Search ............... 327/77, 327/78, 80, 81, 87, 90
See application file for complete search history.

(56) References Cited

U.S. PATENT DOCUMENTS

| | | | |
|---|---|---|---|
| 5,744,998 A | 4/1998 | Ito et al. ................. 327/537 |
| 5,760,614 A * | 6/1998 | Ooishi et al. ............ 327/77 |
| 6,008,674 A * | 12/1999 | Wada et al. ............. 327/89 |
| 6,031,397 A * | 2/2000 | Banba .................... 327/81 |
| 6,046,627 A | 4/2000 | Itoh et al. ............... 327/546 |
| 6,281,716 B1 | 8/2001 | Mihara .................. 327/80 |
| 6,335,893 B1 | 1/2002 | Tanaka et al. ........... 365/226 |

FOREIGN PATENT DOCUMENTS

| | | |
|---|---|---|
| JP | 59-89031 | 5/1984 |
| JP | 2-199863 | 8/1990 |
| JP | 03-196318 | 8/1991 |
| JP | 05-160716 | 6/1993 |
| JP | 8-272467 | 10/1996 |
| JP | 09-055084 | 2/1997 |
| JP | 9-288523 | 11/1997 |
| JP | 2875303 | 11/1999 |
| JP | 2000-100184 | 4/2000 |
| JP | 2000-223586 | 11/2000 |
| JP | 2001-332625 | 11/2001 |
| JP | 2005-311546 | 11/2005 |
| WO | WO 03/094235 A1 | 11/2003 |

* cited by examiner

*Primary Examiner*—Lincoln Donovan
*Assistant Examiner*—Hai L Nguyen

(57) ABSTRACT

A voltage detection circuit for accurately detecting a voltage that is unaffected by fluctuation due to variations in transistor characteristics and threshold voltage. The voltage detection circuit includes a reference current generating section and a detecting section. The reference current generating section includes a voltage-controlled current source that includes a control terminal, a reference terminal and an output terminal. The reference current generating section generates an output current that serves as a reference current and output to a current mirroring circuit. The detecting section includes a number of voltage-controlled current sources each with the same configuration as the voltage-controlled current sources in the current generating section. A potential to be detected is input into the detecting section. A target potential is calculated as the set potential multiplied by the number of voltage-controlled current sources in the detecting section. When the absolute value of the potential to be detected equals the target potential, the currents in each of the voltage-controlled current sources in the detecting section is set equal to the set potential. Due to the equivalent configurations of the voltage-controlled current sources, the current flowing in the reference current generating section is balanced with, and becomes equal to the current in the detecting section. The detection is made by current comparison between the reference current output from the reference current generating section and the detection current flowing in the detecting section.

20 Claims, 12 Drawing Sheets

VOLTAGE DETECTOR CIRCUIT

CROSS-REFERENCES TO RELATED APPLICATIONS

This is a continuation in part of International Application No. JP2006/320696, filed Oct. 18, 2006 which was not published in English under PCT Article 21(2).

FIELD OF THE INVENTION

The present invention relates to a voltage detector circuit and more particularly to a current detector circuit capable of accurate voltage detection unaffected by the fluctuation of transistor characteristics and threshold voltages.

BACKGROUND OF THE INVENTION

Circuits presently and historically constructed and used for the purposes of voltage detection suffer from various conditions that limit their accuracy, and/or their flexibility, thereby compromising the circuit's efficacy for its intended purpose. FIG. 1 shows a circuit diagram of one embodiment of the negative voltage VBB (VBN) level sensor circuit disclosed in International Application Publication No. WO2003/094235. An N-channel MOSFET Q172, in which a constant voltage VREF is applied between the gate and the source, generates a constant current and based on this constant current, a current mirror circuit generates a current i101 that serves as a reference. A plurality of N-channel MOSFETs is serially-coupled to a current path to supply a substrate voltage VBB. The plurality of series MOSFETs are provided with a control terminal used for controlling process variations in the device. Concretely, when the substrate voltage VBB stated above is −1.0 (V), a trimming operation is performed such that the current i102 flowing in the series MOSFETs is balanced against the current i101. The balance between the current i102 flowing in the MOSFET Q176 and the current i101 is adjusted such that the source potential of the MOSFET Q176 coincides with the ground potential VSS.

The prior art technique shown in FIG. 1, however, presents the problem that the detected potential of the substrate voltage VBB may deviate owing to variations in the threshold voltage and NMOS characteristics (e.g., temperature) and therefore the substrate voltage VBB cannot be accurately adjusted to a target value.

Further, the prior art technique shown in FIG. 1 detects the current i101 generated from the constant voltage VREF and does not have the function of detecting the constant voltage VREF. Since the target value for the substrate voltage VBB is dependent on the circuit configuration and therefore cannot be determined by the constant voltage VREF, the substrate voltage VBB cannot be controlled in correspondence with the constant voltage VREF and therefore the degree of freedom for setting the substrate voltage VBB disadvantageously decreases.

SUMMARY OF THE INVENTION

The present invention has been made to overcome the above drawbacks of the prior art and provide a voltage detector circuit capable of accurate voltage detection unaffected by the fluctuation of transistor characteristics and is capable of increasing the degree of freedom for setting a target potential.

According to an embodiment of the present invention, there is provided a voltage detector circuit comprising: a reference current generating section having one voltage-controlled current source and a detecting section having n number (n is a natural number) of voltage-controlled current sources of the same configuration. A reference current is generated in the reference current generating section from a set potential and a given reference potential. The reference current is output to a current mirroring circuit that is also connected to the detecting section by a first node. The detecting section receives an input of the current to be detected. The absolute value of the set potential multiplied by the number of voltage-controlled current sources in the detecting section is set as the target potential of the current to be detected. Once the current to be detected reaches the target potential, the current in the detecting section is set equal to the current to be detected, which, due to the identical configuration in the reference current generating section, becomes the current in the current mirror circuit, which also adjusts the value of the first node accordingly. Subsequent deviation from the target potential is detected and output. In the voltage detector circuit according to an embodiment of the invention, the detection is carried out by making a comparison between the current flowing in the detecting section and the reference current. Accordingly, the detection is made without being affected by threshold voltage variations and the fluctuation of transistor characteristics caused by changes in temperature, so that the accuracy of the detection result can be increased. In addition, by use of a stable potential unaffected by the fluctuation of various transistor characteristics as the set potential, the fluctuation of the target potential can be restrained, resulting in an increase in the accuracy of the detecting operation. Further, since the target potential is a value that is n times the set potential, the target potential can be varied by changing the set potential and thus, the degree of freedom for setting the target potential can be increased.

According to the invention, it is possible to provide a voltage detector circuit that enables accurate voltage detection unaffected by the fluctuation of transistor characteristics etc. and an increased degree of freedom for setting the target potential.

DETAILED DESCRIPTION

Reference will now be made in detail to various embodiments in accordance with the invention, examples of which are illustrated in the accompanying drawings. While the invention is now described in conjunction with various embodiments, it will be understood that these various embodiments are not intended to limit the invention to these embodiments. On the contrary, the invention is intended to cover alternatives, modifications and equivalents, which may be included within the scope of the invention as construed according to the claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
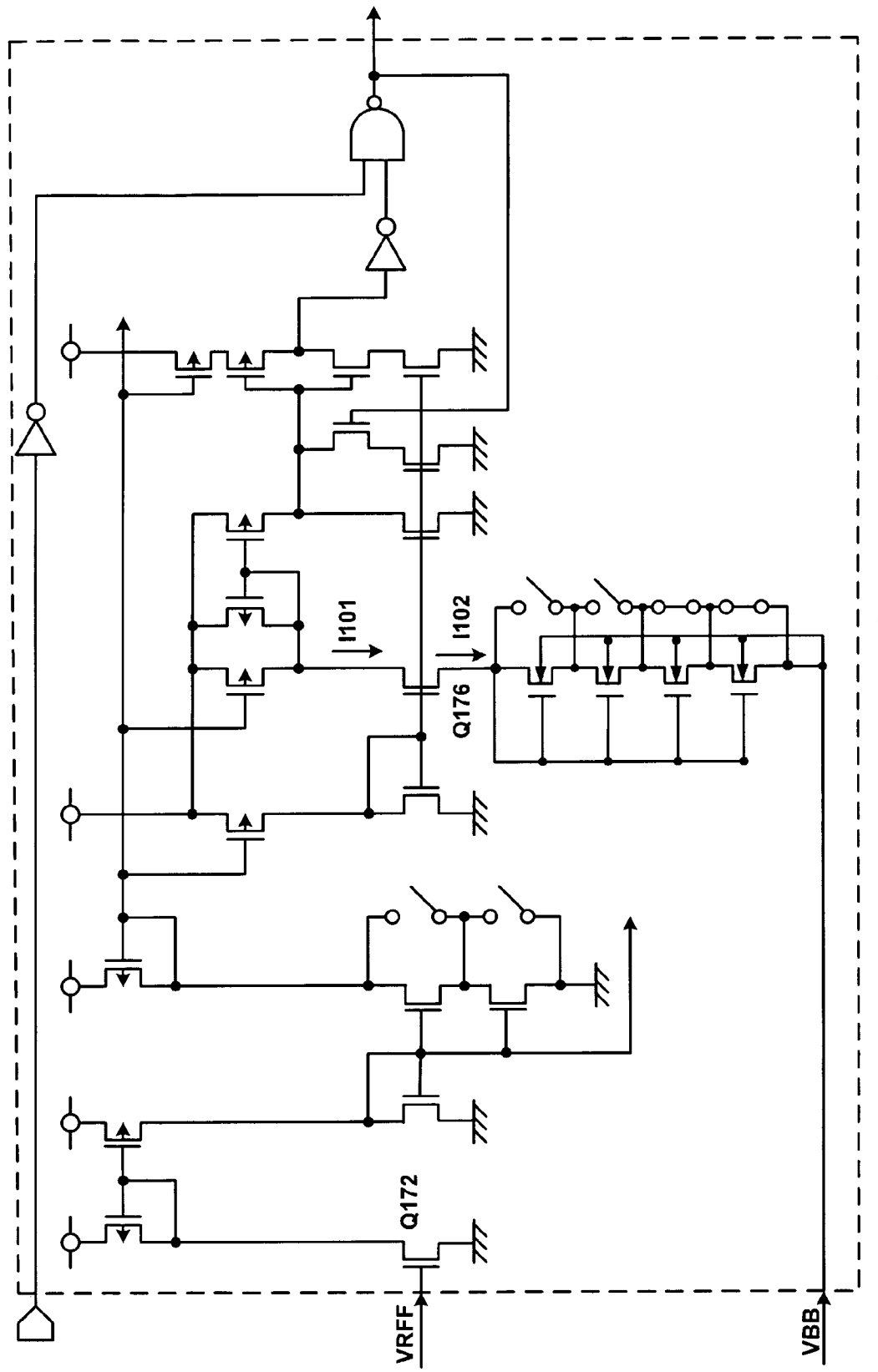
FIG. 1 is a circuit diagram of the negative voltage VBB (VBN) level sensor circuit disclosed in International Application Publication No. WO2003/094235.
Figure 2:
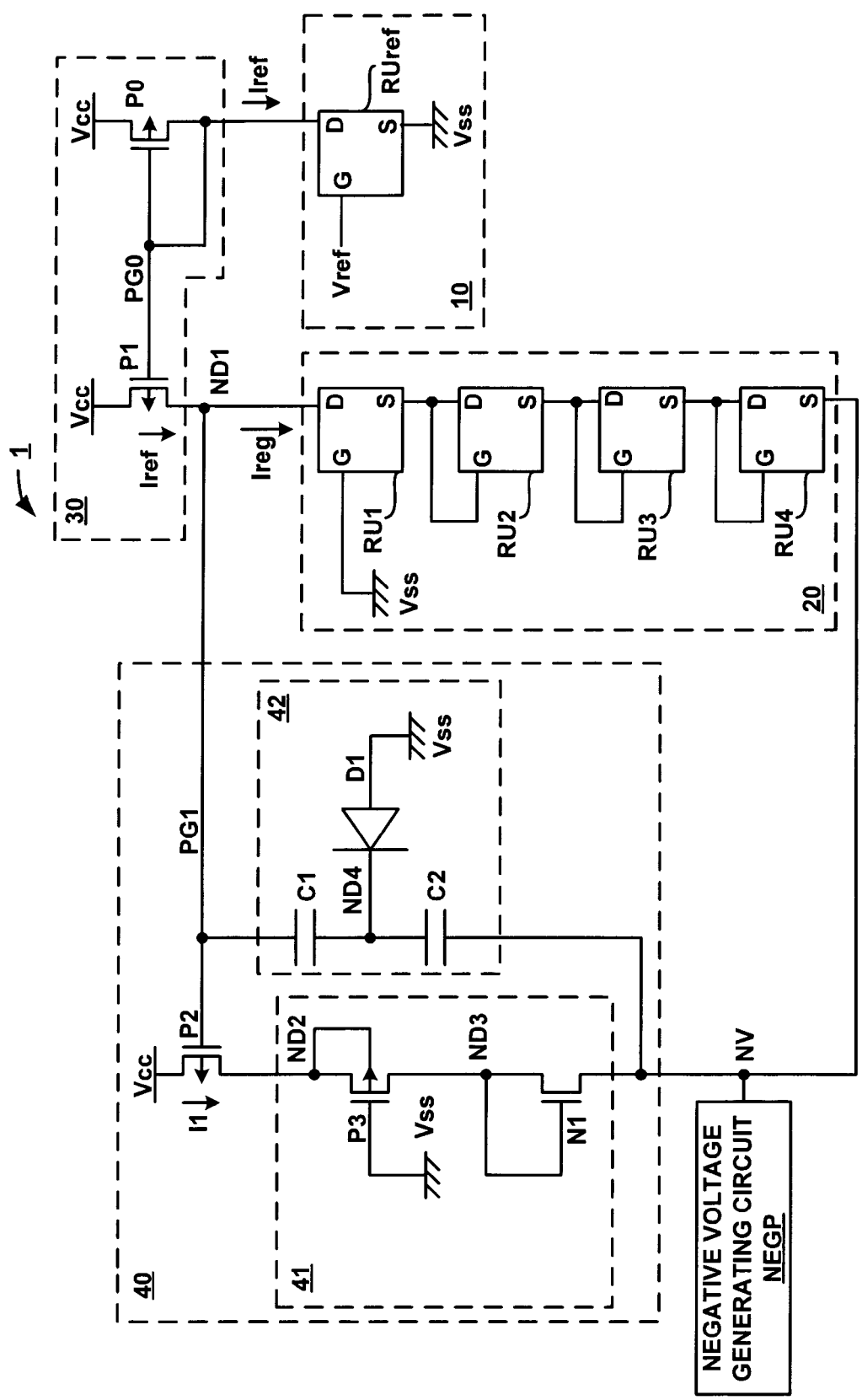
FIG. 2 is a circuit diagram of a voltage detector circuit 1 in accordance with an embodiment of the invention.

Referring now to FIGS. 2 to 5 of the accompanying drawings, the voltage detector circuit of the invention will be hereinafter described in detail according to preferred embodiments. A first embodiment is now explained. FIG. 2 shows a circuit diagram of a voltage detector circuit 1 constructed according to an embodiment of the invention. The voltage detector circuit 1 is for supplying a negative potential accurately adjusted to a target value and is used, for instance, in a flash memory. In a flash memory, highly accurately controlled positive and negative high voltages are required in order to correctly control the quantity of electric charge drawn from or injected into the floating gates of the memory cells. The voltage detector circuit 1 includes a reference current generating section 10, a detecting section 20, a current mirror circuit 30, a voltage control circuit 40 and a negative voltage generating circuit NEGP.

The current mirror circuit 30 includes PMOS transistors P0, P1. The gate terminal and drain terminal of the PMOS transistor P0 are commonly coupled to the gate terminal of the transistor P1. A power supply potential Vcc is applied to the source terminals of the PMOS transistors P0, P1. The drain terminal of the PMOS transistor P0 serves as the input terminal of the current mirror circuit 30 and is coupled to the reference current generating section 10. The drain terminal of the PMOS transistor P1 serves as the output terminal of the current mirror circuit 30 and is coupled to the detecting section 20 and a PMOS transistor P2.

The reference current generating section 10 has one voltage-controlled current source RUref having a control terminal G, a reference terminal S and an output terminal D. A set potential Vref is input to the control terminal G and a ground potential Vss is input to the reference terminal S. In this embodiment, the set potential Vref is correctly set to 1.25 (V) by a bandgap reference circuit (not shown). A reference current Iref, which is determined by a control terminal to reference terminal voltage Vgs that is the potential of the control terminal G relative to the reference terminal S, flows to the output terminal D. In this embodiment, the control terminal to reference terminal voltage Vgs is equal to the set potential Vref.

The detecting section 20 has voltage-controlled current sources RU1 to RU4 serially-coupled and arranged in four stages. The voltage potential Vss is input to the control terminal G of the voltage-controlled current source of the front circuit stage RU1 and the output terminal D of the voltage-controlled current source RU1 is coupled to the output terminal of the current mirror circuit 30 through a first node ND1. The control terminal G and output terminal D of each of the voltage-controlled current sources RU2 to RU4 are commonly coupled to each other and coupled to the reference terminal S of its associated preceding voltage-controlled current source RU1, RU2 or RU3. The reference terminal S of the voltage-controlled current source of the last circuit stage RU4 is coupled to the output node of the negative voltage generating circuit NEGP. Output from the first node ND1 is a voltage PG1 that is a detection result.

The voltage control circuit 40 has the PMOS transistor P2, a breakdown protection circuit 41 and an oscillation protection circuit 42. The voltage PG1 is input to the gate terminal of the PMOS transistor P2, the power supply potential Vcc is input to the source terminal and the drain terminal is coupled to the breakdown protection circuit 41. The breakdown protection circuit 41 includes a PMOS transistor 3 and an NMOS transistor N1. The ground potential Vss is input to the gate terminal of the PMOS transistor P3. The source terminal and back gate terminal of the PMOS transistor P3 are commonly coupled to each other at a node ND2 and coupled to the drain terminal of the PMOS transistor P2. The gate terminal and drain terminal of the NMOS transistor N1 are commonly coupled to each other at a node ND3 and coupled to the drain terminal of the PMOS transistor P3. The oscillation protection circuit 42 includes capacitors C1, C2 and a diode D1. The capacitors C1, C2 are serially-coupled to each other at a node ND4 and inserted between the output node of the negative voltage generating circuit NEGP and the first node ND1. The anode terminal of the diode D1 is coupled to the ground potential Vss and the cathode terminal is coupled to the node ND4.

Figure 3:
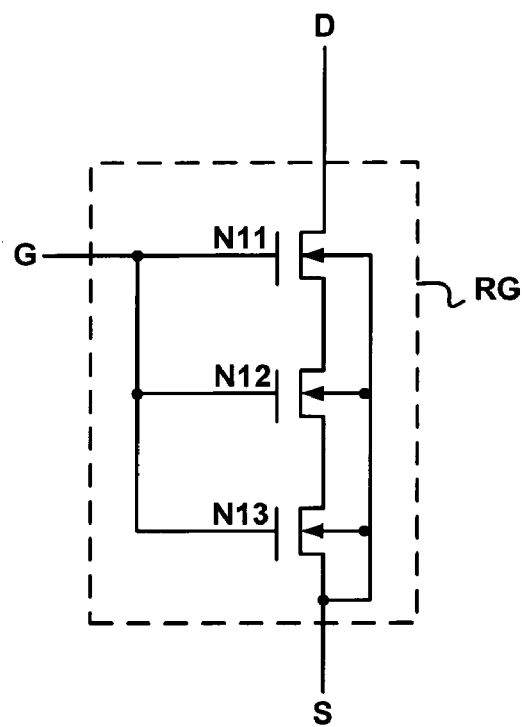
FIG. 3 is a circuit diagram of a voltage-controlled current source RG in accordance with an embodiment of the invention.

The voltage-controlled current source RUref and the voltage-controlled current sources RU1 to RU4 are all constituted by the same voltage-controlled current source RU. FIG. 3 shows a circuit diagram of the voltage-controlled current source RG in accordance to an embodiment of the invention. The voltage-controlled current source RG has an NMOS transistor N11 the gate terminal of which is coupled to the control terminal G and the drain terminal of which is coupled to the output terminal D. Placed between the source terminals of the NMOS transistor N11 and the reference terminal S are two serially-coupled NMOS transistors N12, N13. The gate transistors of the NMOS transistors N12, N13 are commonly coupled to the gate terminal of the NMOS transistor N11. The drain terminals of the NMOS transistors N12, N13 are coupled to the source terminals of the NMOS transistors N11, N12, respectively. The source terminal of the NMOS transistor N13 is coupled to the reference terminal S. The back gate terminals of the NMOS transistors N11 to N13 are commonly coupled to the reference terminal S. The NMOS transistors N12, N13 are transistors for adjustment of the value of the reference current Iref and adjust the value of the reference current Iref by "ON" resistance.

The operation of the voltage detector circuit 1 is now described. The reference current generating section 10 is a circuit for generating the reference current Iref. The set potential Vref (1.25 (V)) is input to the control terminal G of the voltage-controlled current source RUref, thereby generating the reference current Iref corresponding to the set potential Vref. The reference current Iref generated in the voltage-controlled current source RUref is input to the input terminal of the current mirror circuit 30. Then, the current mirror circuit 30 outputs the reference current Iref through its output terminal after mirroring.

The detecting section 20 is a circuit for detecting the deviation of a negative voltage NV supplied from the negative voltage generating circuit NEGP from a target potential TV. The detecting section 20 has the four serially-coupled voltage-controlled current sources RU1 to RU4. The reference terminal S of the voltage-controlled current source of the last circuit stage RU4 is supplied with the negative voltage NV. The control terminal G of the voltage-controlled current source RU1 of the front circuit stage receives an input of the ground potential Vss. The current flowing in the detecting section 20 is defined as a detection current Ireg. As described later, the value obtained by multiplying the value (1.25 (V)) of the set potential Vref by the number (four) of voltage-controlled current sources RU in the detecting section 20 is the absolute value of the target potential TV (5.00 (V)). In the detecting section 20 having such a configuration, when the absolute value of the negative voltage NV becomes equal to the target potential TV (5.00 (V)), the control terminal to reference terminal voltage Vgs of each of the voltage-controlled current sources RU1 to RU4 becomes equal to the set potential Vref, that is, 1.25 (V). Since the voltage-controlled current source RUref and the voltage-controlled current sources RU1 to RU4 are all constituted by the same voltage-controlled current source RU (FIG. 3), the detection current Ireg becomes equal to the reference current Iref. Therefore, the voltage PG1 of the first node ND1 is a constant value. A current I1 flowing in the PMOS transistor P2 has also a constant value.

If the negative pressure NV drops from −5.00 (V) to, for instance, −5.50 (V), the absolute value of the negative voltage NV becomes large and the control terminal to reference terminal voltage Vgs of the voltage-controlled current source RU1 of the front circuit stage of the detecting section 20 becomes higher than the set potential Vref. Thereafter, the detection current Ireg flowing in the detecting section 20 increases and becomes greater than the reference current Iref, so that the voltage PG1 of the first node ND1 drops. As the voltage PG1 drops, the current I1 flowing in the PMOS transistor P2 increases so that the negative voltage NV rises. Similarly, if the negative voltage NV rises from −5.00 (V) to, for instance, −4.50 (V), the absolute value of the negative voltage NV becomes small and the control terminal to reference voltage Vgs of the voltage-controlled current source RU1 of the front circuit stage of the detecting section 20 becomes smaller than the set potential Vref. Thereafter, the detection current Ireg flowing in the detecting section 20 decreases and becomes smaller than the reference current Iref, so that the voltage PG1 potential of the first node ND1 rises. As the voltage PG1 rises, the current I1 flowing in the PMOS transistor P2 drops and therefore the negative voltage NV drops.

With the above arrangement, an adjustment is made such that the reference current Iref is balanced against the detection current Ireg. Thereby, the absolute value of the negative voltage NV can be adjusted to the predetermined target potential TV. Next, the operation of the breakdown protection circuit 41 provided in the voltage control circuit 40 is explained. Since the ground potential Vss is input to the gate terminal of the PMOS transistor P3, the potential of the node ND2 is prevented from dropping to a value equal to or lower than a threshold voltage VtP of the PMOS transistor P3. Therefore, the voltage difference between the power supply potential Vcc and the first node ND1, which is the voltage applied between the source terminal and drain terminal of the PMOS transistor P2, is made small, so that occurrence of breakdown can be prevented. Since the NMOS transistor N1 is diode-connected, the potential of the node ND3 increases from the negative voltage NV by the value equal to the threshold voltage VtN of the NMOS transistor N1. Since the voltage difference between the nodes ND2 and ND3, which is the voltage to be applied between the source terminal and drain terminal of the PMOS transistor P3, is made small, occurrence of breakdown can be prevented. It should be noted that the number of NMOS transistors N1 is not limited to 1 but a plurality of NMOS transistors N1 may be provided.

Next, the operation of the oscillation protection circuit 42 provided in the voltage control circuit 40 is described. The capacitors C1, C2 are for preventing the oscillation of the negative voltage NV. In cases where the capacitors C1, C2 are not provided, a sequence of events, that is, a drop in the negative voltage NV $\Rightarrow$ a drop in the voltage PG1 $\Rightarrow$ a rise in the negative voltage NV $\Rightarrow$ a rise in the voltage PG1 $\Rightarrow$ a drop in the negative voltage NV, repeatedly occurs, so that the negative voltage NV oscillates. This oscillation is attributable to the phase deviation between the negative voltage NV and the voltage PG1. Therefore, the oscillation of the negative voltage NV can be prevented by preventing the phase deviation between these voltages by use of the capacitors C1, C2.

By the serial connection of the capacitors C1, C2, the potential difference between the negative voltage NV and the voltage PG1 is prevented from exceeding a specified input voltage value of the capacitors. In addition, by connecting the node ND4, which is an intermediate node, to the ground potential Vss through the diode D1, the node ND4 is prevented from coming into a floating condition and the potential of the node ND4 is clamped to the ground potential Vss. Accordingly, an unfavorable situation in which breakdown takes place in the capacitor C1 owing to a drop in the potential of the node ND4 can be avoided.

As described hereinabove, in the voltage detector circuit 1 of the first embodiment, the target potential TV of the absolute value of the negative voltage NV can be set to the value (5.00 (V)) that is obtained by multiplying the value (1.25 (V)) of the set potential Vref by the number of voltage-controlled current sources RU1 to RU4 (four times) provided in the detecting section 20. And, the deviation of the negative voltage NV from the target potential TV can be detected and the result of the detection can be output from the first node ND1. Additionally, an adjustment can be made by the voltage control circuit 40 such that the reference current Iref is balanced against the detection current Ireg, whereby the negative voltage NV can be adjusted to the predetermined target potential TV. In the voltage detector circuit 1, detection is made by current comparison between the reference current Iref output from the reference current generating section 10 and the detection current Ireg flowing in the detecting section. This enables more accurate detection unaffected by e.g., variations in the threshold voltage and the fluctuation of transistor characteristics owing to changes in temperature.

Since the target potential TV is n times the set potential Vref, the target potential can be varied by changing the value of the set potential Vref, and thus, the degree of freedom for setting the target potential can be increased. In addition, the target potential TV can be made to be a correct value which does not fluctuate, by making the set potential Vref be a correct value unaffected by various fluctuations with the use of a bandgap reference circuit or the like. As a result, the accuracy of the detecting operation can be increased.

Figure 4:
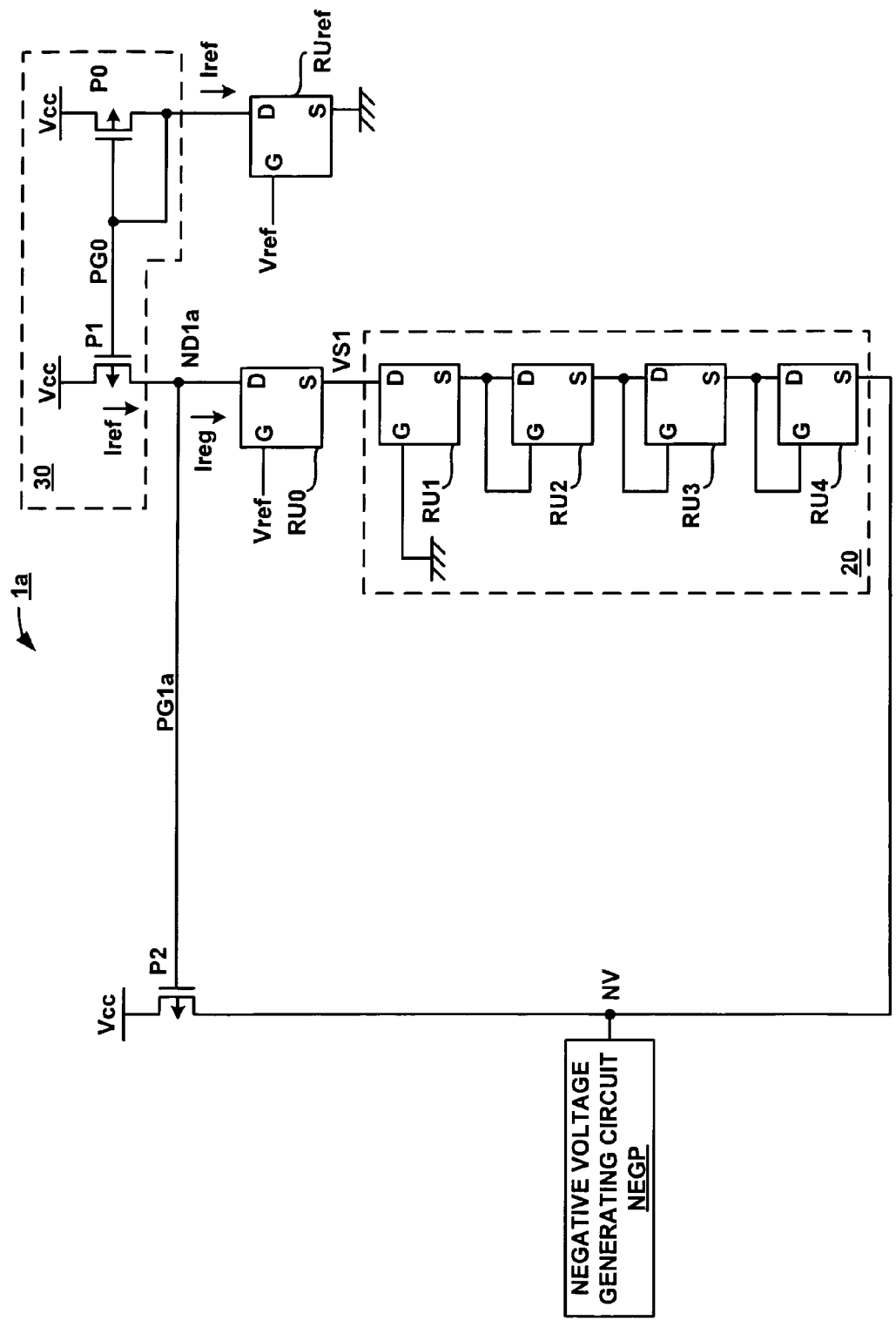
FIG. 4 is a circuit diagram of a voltage detector circuit 1a in accordance with an embodiment of the invention.

In addition, the target potential TV is n times the set potential Vref (n=natural number) and values such as 1.5 are not used in the multiplication. The voltage detector circuit 1 can be implemented with a simpler circuit configuration by making the target potential TV be such a discrete value, which leads to circuit scale reduction etc. Reference is made to FIG. 4 to describe a voltage detector circuit 1a according to a second embodiment of the invention. The voltage detector circuit 1a has a configuration which can be attained by adding a voltage-controlled current source RU0 to the voltage detector circuit 1 of the first embodiment. The control terminal G of the voltage-controlled current source RU0 receives an input of the set potential Vref, the output terminal D is coupled to the output terminal of the current mirror circuit 30, and the reference terminal S is coupled to the output terminal D of the voltage-controlled current source RU1 of the front circuit stage. The voltage detector circuit 1a of the second embodiment does not differ in configuration from the voltage detector circuit 1 of the first embodiment except the above points and therefore, a detained explanation thereof is skipped herein.

The operation of the voltage detector circuit 1a is now described. Since the detecting section 20 has four voltage-controlled current sources RU1 to RU4, the target potential TV is 5.00 (V) that is four times the set potential Vref. When the absolute value of the negative voltage NV becomes equal to the target potential TV, i.e., 5.00 (V), the control terminal to reference terminal voltage Vgs of each of the voltage-controlled current sources RU1 to RU4 becomes equal to the set potential Vref, i.e., 1.25 (V) and the control terminal to reference terminal voltage Vgs of the voltage-controlled current source RU0 becomes equal to the set potential Vref. Then, the detection current Ireg becomes equal to the reference current Iref and therefore the voltage PG1a of the first node ND1a becomes a constant value. With this arrangement, the reference current Iref is made to be balanced against the detection current Ireg similarly to the voltage detector circuit 1 of the first embodiment, so that the absolute value of the negative voltage NV can be adjusted to the predetermined target potential TV.

By inserting the voltage-controlled current source RU0, the value of the voltage PG1a in its steady condition is made equal to the value of the voltage PG0. Thereby, the source-drain voltages of the PMOS transistors P0, P1 become the same, so that the current can be more accurately mirrored in the current mirror circuit 30.

Figure 5:
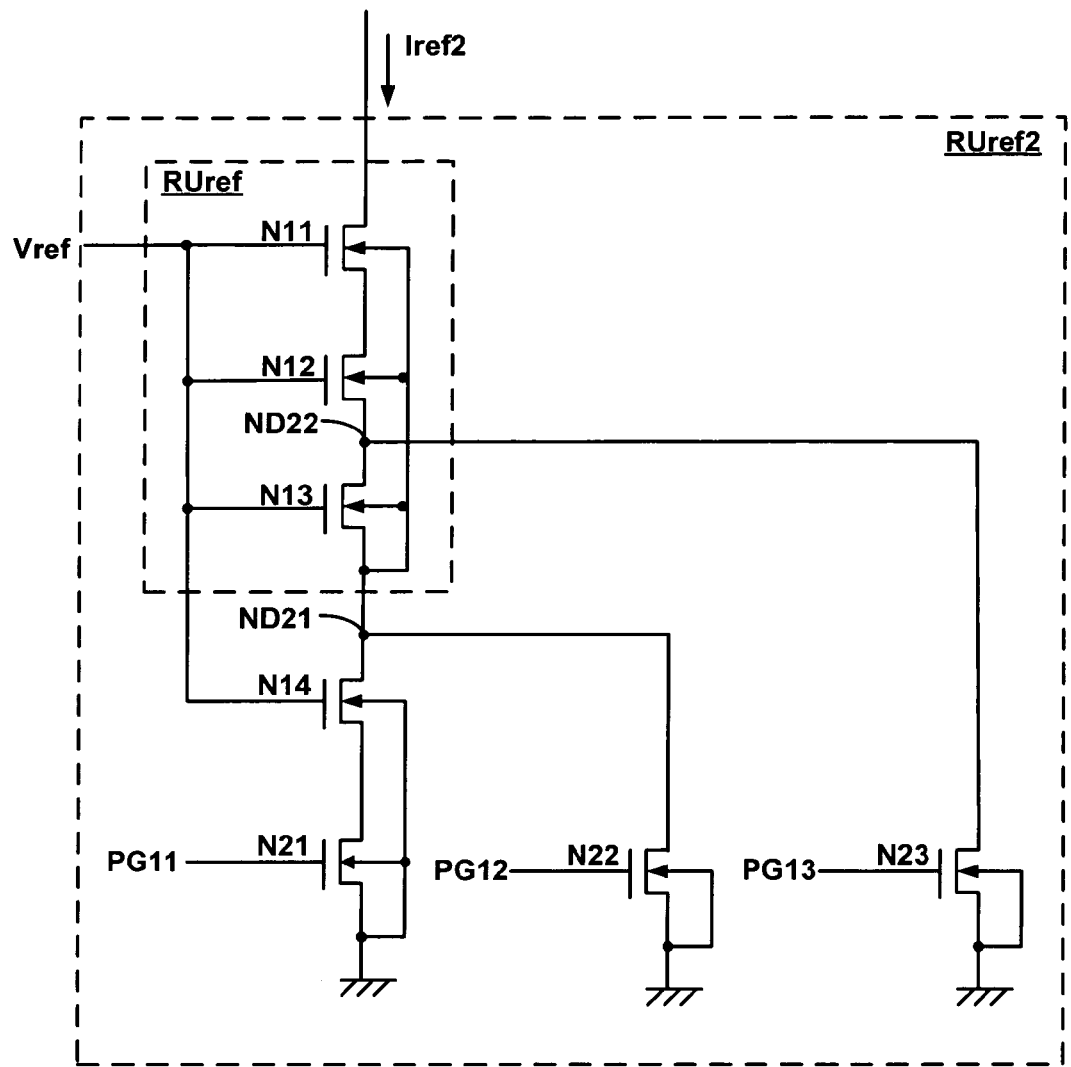
FIG. 5 is a circuit diagram of a voltage-controlled current source RUref2 in accordance with an embodiment of the invention.

Referring to FIG. 5, a voltage-controlled current source RUref2 according to a third embodiment of the invention is now described. The voltage-controlled current source RUref2 has the voltage-controlled current source RUref and NMOS transistors N14, N21, N22, N23. The "ON" resistance of the NMOS transistors N21 to N23 is so small that it is negligible and serves as a switch. Gate voltages PG11 to PG13 are input to the gate terminals of the NMOS transistors N21 to N23, respectively. The gate voltages PG11 to PG13 are controlled to the power supply potential Vcc or the ground potential Vss. In each of the NMOS transistors N21 to N23, a source terminal is coupled to the ground potential Vss and a back gate terminal is coupled to the source terminal. In the NMOS transistor N14, a source terminal is coupled to the drain terminal of the NMOS transistor N21, a drain terminal is coupled to the source terminal of the NMOS transistor N13, and a gate terminal receives an input of the set potential Vref. The drain terminal of the NMOS transistor N22 is coupled to a connection node ND 21 of the NMOS transistors N13 and N14. The drain terminal of the NMOS transistor N23 is coupled to a connection node ND22 of the NMOS transistor N12 and N13.

There is now explained a case where the voltage-controlled current source RUref2 is used in place of the voltage-controlled current source RUref provided in the reference current generating section 10 (FIG. 2) of the first embodiment. In this case, the current flowing in the voltage-controlled current source RUref2 is defined as a reference current Iref2. When a gate voltage PG12 has the power supply potential Vcc and gate voltages PG11 and PG13 have the ground potential Vss, only the NMOS transistor N22 becomes conductive so that the NMOS transistor N14 is bypassed. In this configuration, the NMOS transistors N11 to N13 are serially-coupled, so that the voltage-controlled current source RUref2 becomes equivalent to the voltage-controlled current source RUref. As a result, the reference current Iref2 becomes equal to the reference current Iref of the first embodiment.

If the gate voltage PG13 has the power supply potential Vcc and the gate voltages PG11 and PG12 have the ground potential Vss, only the NMOS transistor N23 becomes conductive so that the NMOS transistors N13 and N14 are bypassed. In this configuration, the NMOS transistors N11 and N12 are serially-coupled and accordingly, the number of serially-coupled transistors decreases, so that the reference current Iref2 becomes higher than the reference current Iref of the first embodiment. On the other hand, the circuit configuration of the voltage-controlled current sources RU1 to RU4 of the detecting section 20 (FIG. 2) does not change. In this configuration, the amount of voltage drop in each of the voltage-controlled current sources RU1 to RU4 in the case where the reference current Iref2 flows in the detecting section 20 exceeds the set potential Vref.

Thereby, the value of the target potential TV can be made large. If the gate voltage PG11 has the power supply potential Vcc and the gate voltages PG12 and PG13 have the ground potential Vss, only the NMOS transistor N21 becomes conductive so that no transistors are bypassed. In this case, the NMOS transistors N11 to N14 are serially-coupled and accordingly, the number of serially-coupled transistors increases, so that the reference current Iref2 becomes lower than the reference current Iref of the first embodiment. Therefore, the amount of voltage drop in each of the voltage-controlled current sources RU1 to RU4 of the detecting section 20 becomes smaller than the set potential Vref. Thereby, the value of the target potential TV can be made small.

In this way, the value of the reference current Iref2 is variably controlled in the voltage-controlled current source RUref2, so that the value of the target potential TV can be further variably adjusted, changing from a value that is n times the set potential Vref. Accordingly, the value of the target potential is not limited to a value that is n times the set potential Vref and therefore the degree of freedom for setting the target potential TV increases. As a result, the value of the negative voltage NV can be adjusted to a desirable value.

Although the NMOS transistors N12, N13 are serially-coupled, the invention is not limited to this. The NMOS transistors N12, N13 are for adjusting the value of the reference current Iref. Therefore, they may be coupled in parallel. The parallel connection is employed for instance in the case of the multi-gate configuration. It is also apparent that the voltage-controlled current source RUref2 may be used in place of the voltage-controlled current sources RU1 to RU4 provided in the detecting section 20 (FIG. 2) of the first embodiment. In this case, by reducing the number of serially-coupled transistors in the voltage-controlled current source RUref2, the amount of voltage drop in each of the voltage-controlled current sources RU1 to RU4 can be made smaller than the set potential Vref, so that the value of the target potential TV can be made small. By increasing the number of serially-coupled transistors in the voltage-controlled current source RUref2, the value of the target potential TV can be made large.

Figure 6:
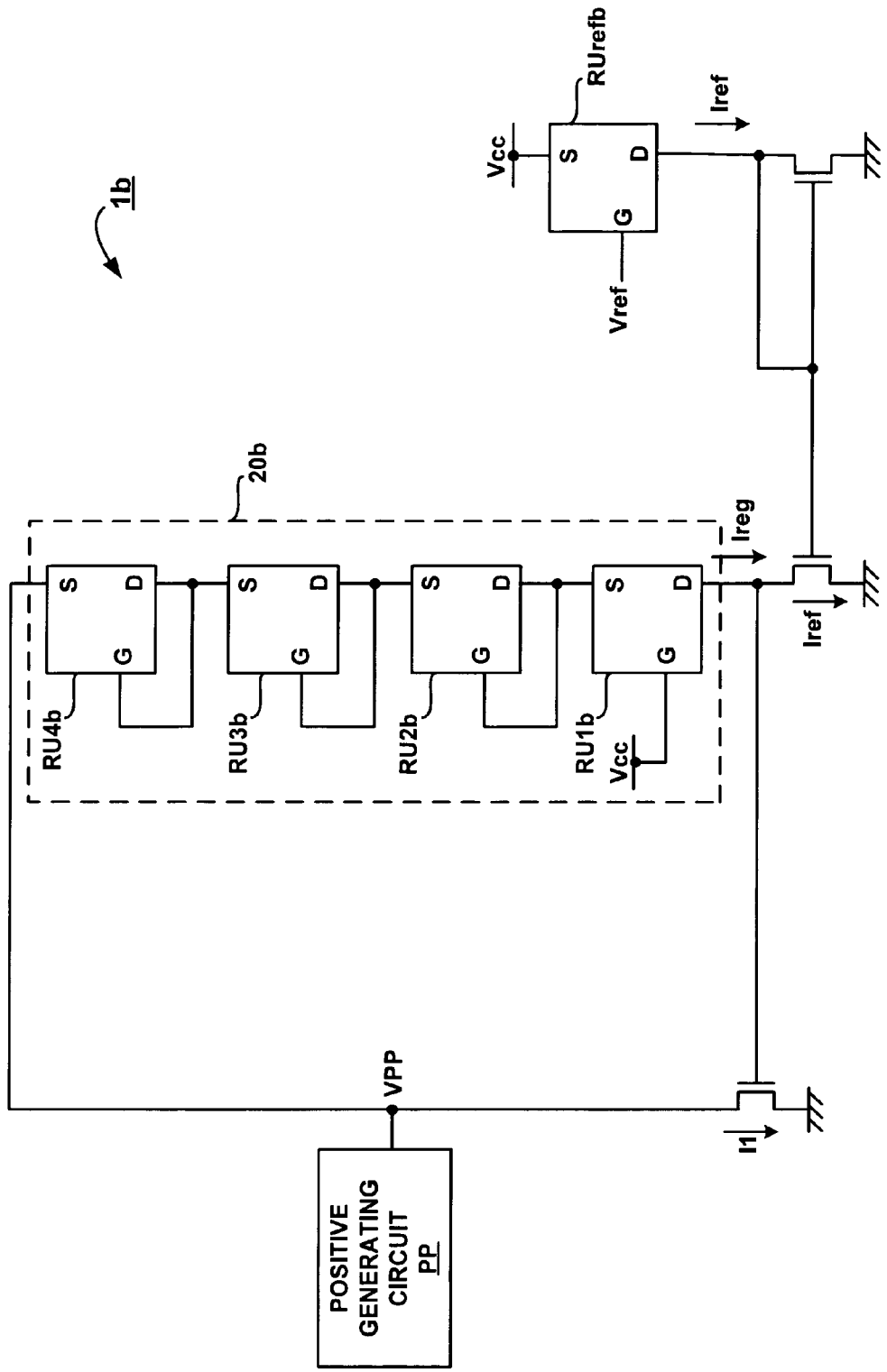
FIG. 6 is a circuit diagram of a voltage detector circuit 1b in accordance with an embodiment of the invention.

It is apparent that the invention is not necessarily limited to the particular embodiments shown herein and various changes and modifications are made to the disclosed embodiments without departing from the spirit and scope of the invention. Although the embodiments have been described in the context of the control of the negative voltage NV, the invention is equally applicable to cases where positive voltage is controlled. As an example, FIG. 6 shows a voltage detector circuit 1b for controlling a positive voltage VPP supplied from a positive voltage generating circuit PP according to an embodiment of the invention. The voltage detector circuit 1b has a circuit configuration that is different from that of the voltage detector circuit 1 (FIG. 2) in that VCC is interchanged with VSS, the PMOS transistors are interchanged with the NMOS transistors, Nwell is interchanged with Pwell, and the P substrate is replaced with an N substrate. A voltage-controlled current source RUrefb and voltage-controlled current sources RU1b to RU4b are all constituted by a PMOS transistor and the G terminal of RU1b is changed to VCC. Thereby, the target potential TV=VPP−VCC. If VCC=3V, the target potential TV (5.00 (V))+VCC (3 (V)) is obtained by adding VCC (3 (V)) to the product (5.00 (V)) obtained by multiplying the value (1.25 (V)) of the set potential Vref by the number of voltage-controlled current sources RU1b to RU4b (i.e., 4 times) provided in the detecting section 20b. And, the positive voltage VPP can be adjusted to the target potential TV (8 (V)).

Figure 7:
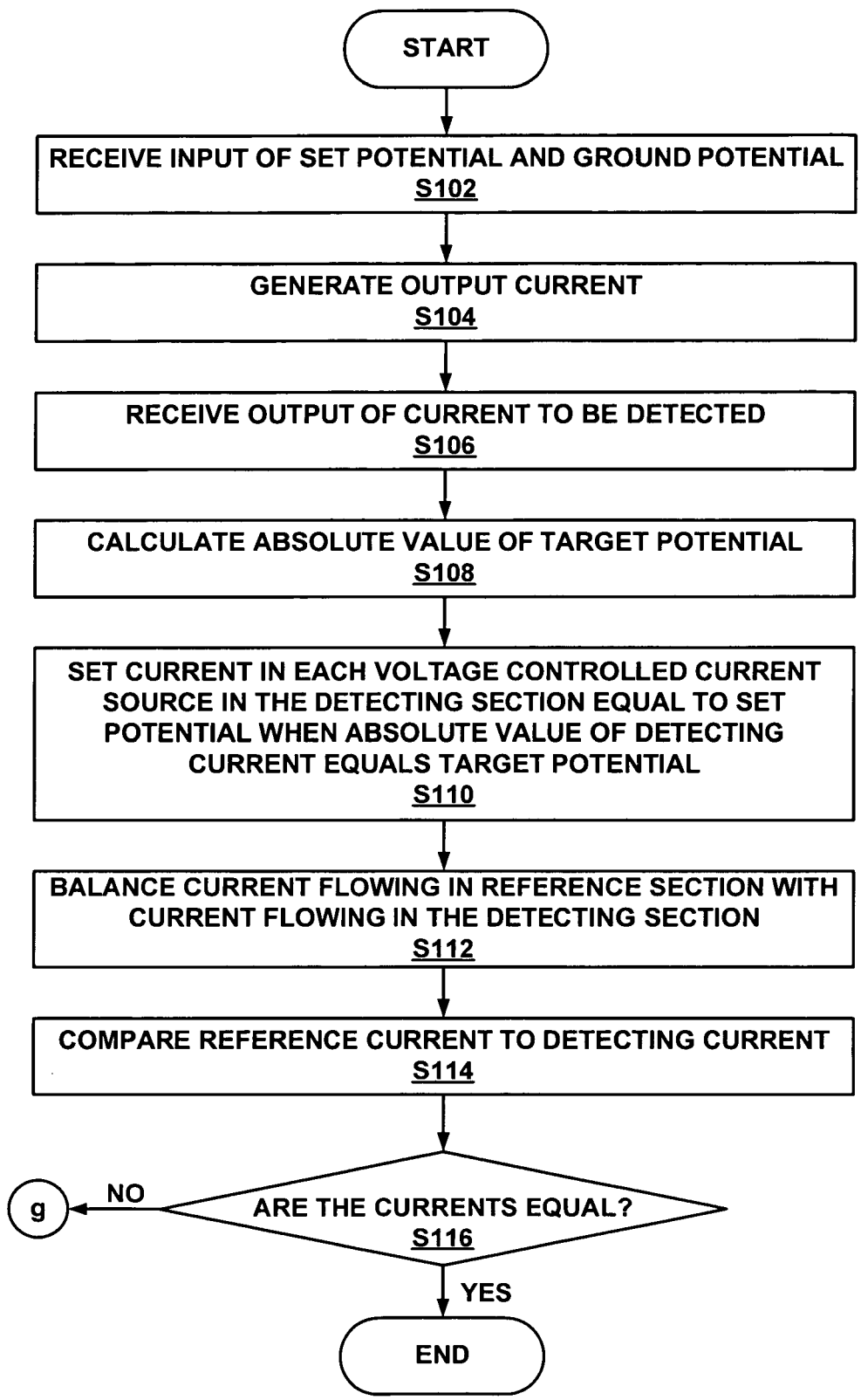
FIG. 7 is a flowchart of the current detection operation performed by the voltage detection circuit in accordance with an embodiment of the invention.

Next, an operation performed by the voltage detector circuit according to the first embodiment of the invention is described. FIG. 7 is a flowchart of the current detector operation to be performed by the voltage detector circuit 1 (FIG. 2). First the reference current generating section 10 receives inputs of a set potential Vref and a ground potential Vss (step S102). The reference current generating section 10 next generates an output current (step S104). The voltage detector circuit 1 next receives an input of a voltage to be detected (step S106). A target potential is set for the voltage to be detected which is calculated as the absolute value of the set potential Vref multiplied by the number of voltage-controlled current sources RU in the detecting section 20 (step S108). If the absolute value of the voltage to be detected NV matches the target potential, the current flowing through each of the voltage controlled current sources RU in the detecting section 20 is set equal to the set potential Vref (step S110). The reference current Iref flowing in the reference generating section 10 is balanced with the detecting current Ireg flowing in the detecting section since the voltage-controlled current sources RU in the detecting section 20 are configured identically as the voltage-controlled current sources RU in the reference current generating section 10, and thereby the first node ND is kept at a constant potential (step S112). The reference current Iref is then compared to the detecting current Ireg to determine if a fluctuation due to variations in transistor characteristics has occurred (step S114). Any deviation is detected and output from the first node ND, absence of a deviation ends the current operative iteration (step S116).

Figure 8A:
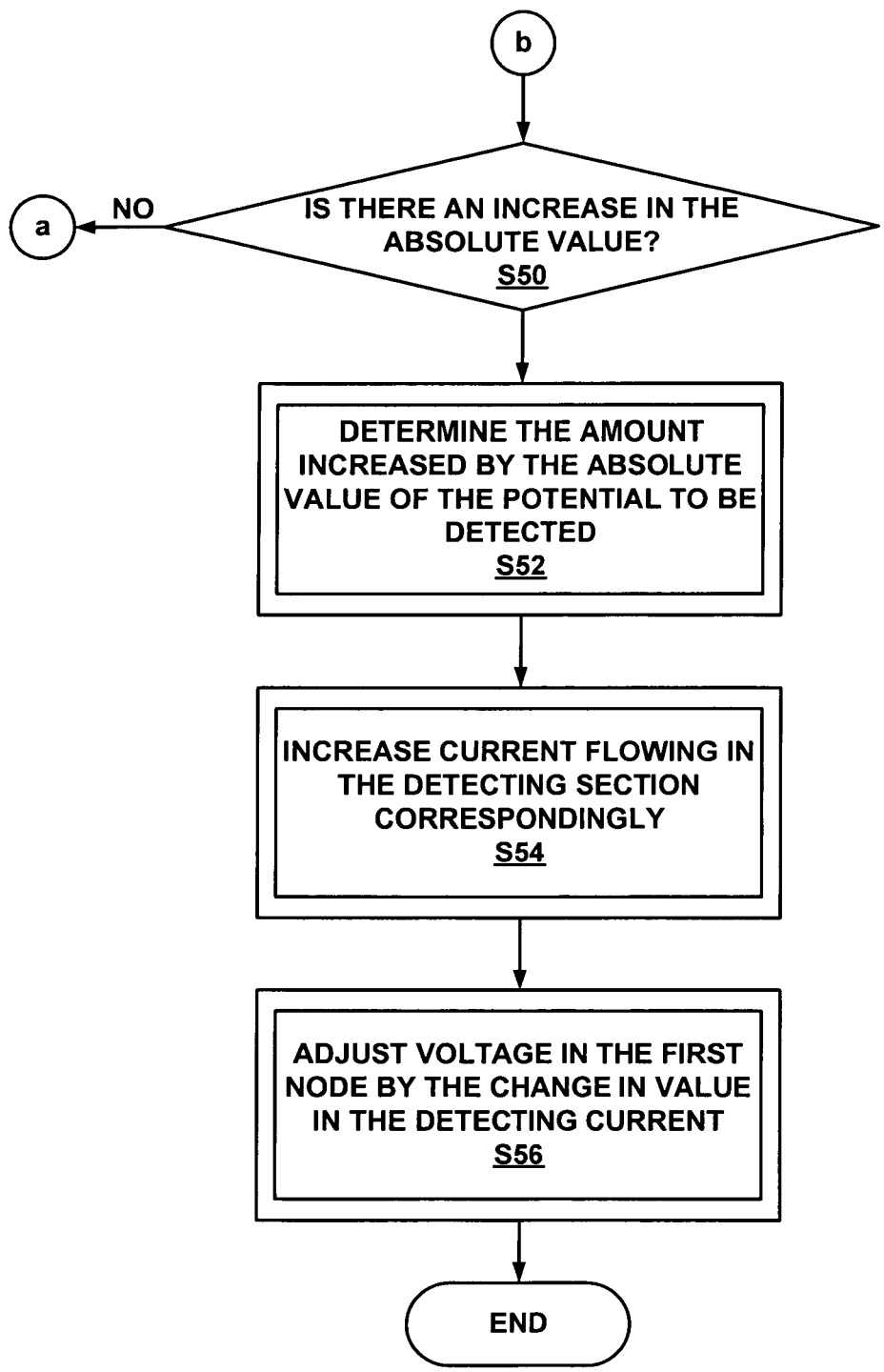
FIGS. 8a and 8b show the flow of data where the absolute value of the potential to be detected changes in value after reaching the target potential in accordance with an embodiment of the invention.
Figure 8B:
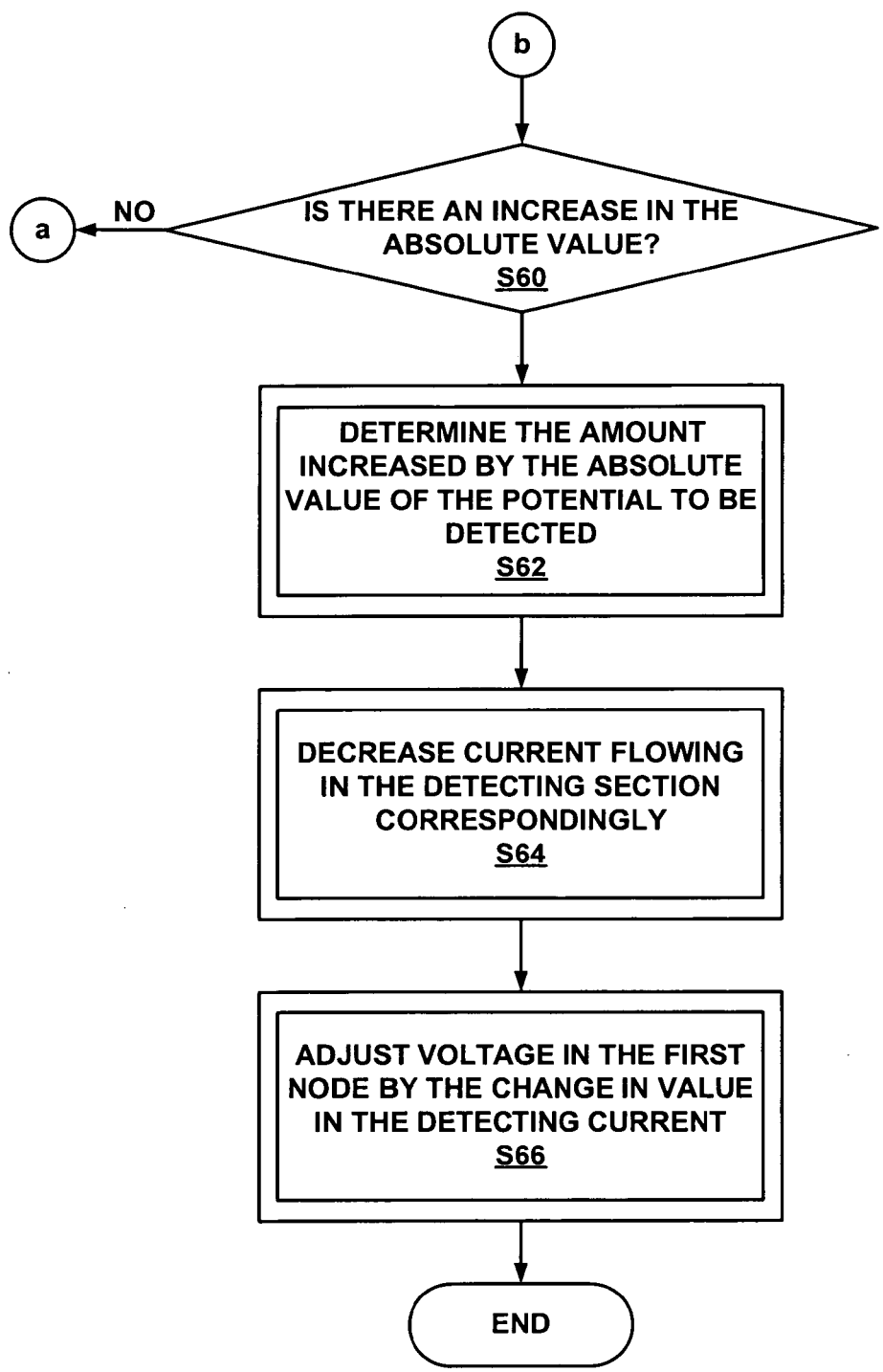

FIGS. 8a and 8b describe an operation performed by the voltage detector circuit according to the first embodiment of the invention when the voltage to be detected changes after reaching the target potential. FIG. 8a is a flowchart of the current detector operation performed by the voltage detector circuit 1 (FIG. 2) when the absolute value of the voltage to be detected NV increases after reaching the target potential. First the voltage detector circuit 1 determines if there is an increase in the absolute value of the voltage to be detected NV (step S50). If no increase in the absolute value of the voltage to be detected NV is determined, the voltage detector circuit 1 ends the operation. If an increase in the absolute value of the voltage to be detected NV is determined, the voltage detector circuit 1 determines the amount of the increase (step S52). Subsequently, the detecting current Ireg becomes greater than the set potential Vref. (step S54). The larger absolute value adjusts the potential of the first node ND, whereby the potential of the first node ND decreases by a value equal to the increase in the absolute value of the voltage to be detected NV if the potential of the voltage to be detected NV is negative, and increases by the same value if the potential of the voltage to be detected NV is positive (step S56), after which the operation ends.

FIG. 8b is a flowchart of the current detector operation performed by the voltage detector circuit 1 (FIG. 2) when the absolute value of the voltage to be detected NV decreases after reaching the target potential. First the voltage detector circuit 1 determines if there is a decrease in the absolute value of the voltage to be detected NV (step S60). If no decrease in the absolute value of the voltage to be detected NV is determined, the voltage detector circuit 1 ends the operation. If a decrease in the absolute value of the voltage to be detected NV is determined, the voltage detector circuit 1 determines the amount of the decrease (step S62). Subsequently, the detecting current Ireg becomes less than the set potential Vref. (step S64). The lesser absolute value adjusts the potential of the first node ND, whereby the potential of the first node ND increases by a value equal to the decrease in the absolute value of the voltage to be detected NV if the potential of the voltage to be detected NV is negative, and decreases by the same value if the potential of the voltage to be detected NV is positive (step S66), after which the operation ends.

Although four serially-coupled voltage-controlled current sources RU1 to RU4 are provided in the detecting section 20 in the first embodiment, the invention is not necessarily limited to this. Obviously, the number of voltage-controlled current sources can be properly determined according to the value of the target potential TV. Where the set potential Vref is 1.25 (V) for instance, 5 voltage-controlled current sources RU are necessary to make the target potential TV be 6.25 (V) and 8 voltage-controlled current sources RU are necessary to make the target potential TV be 10.00 (V). Although the set potential Vref is 1.25 (V) in the foregoing embodiments, the invention is not limited to this and the set potential Vref may be set to other desirable values. Thereby, the target potential TV can be set to desirable values.

In the foregoing embodiments, although the input current to output current ratio in the current mirror circuit 30 is 1:1, the invention is not necessarily limited to this. The need to limit the target potential TV to a value that is n times the set potential Vref can be eliminated by changing the current ratio of the current mirror circuit 30, and thereby the negative voltage NV can be adjusted to desired values.

It should be noted that: the negative voltage NV serves as an example of the potential to be detected; the NMOS transistor N11 serves as an example of the first MOS transistor; the NMOS transistors N12, 13 serve as an example of the second MOS transistors; the PMOS transistor P2 serves as an example of the third MOS transistor; the NMOS transistors N21 to N23 serve as an example of the switch; the negative voltage generating circuit NEGP serves as an example of the first driving circuit; the PMOS transistor P2 serves as an example of the second driving circuit; the ground potential Vss serves as an example of the first specified potential and the second specified potential; the capacitor C1 serves as an example of the first capacitor; and the capacitor C2 serves as an example of the second capacitor.

It is noted that the various embodiments of the invention described herein are applicable to voltage detector circuits and devices that utilize voltage detector circuits, such as flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, the newer flash memory devices have several key advantages, such as being capable of burst-mode access as fast as 80 MHz, page access times as fast as 25 ns, simultaneous read-write operation for combined code and data storage, and low standby power (e.g., 1 µA).

Figure 9:
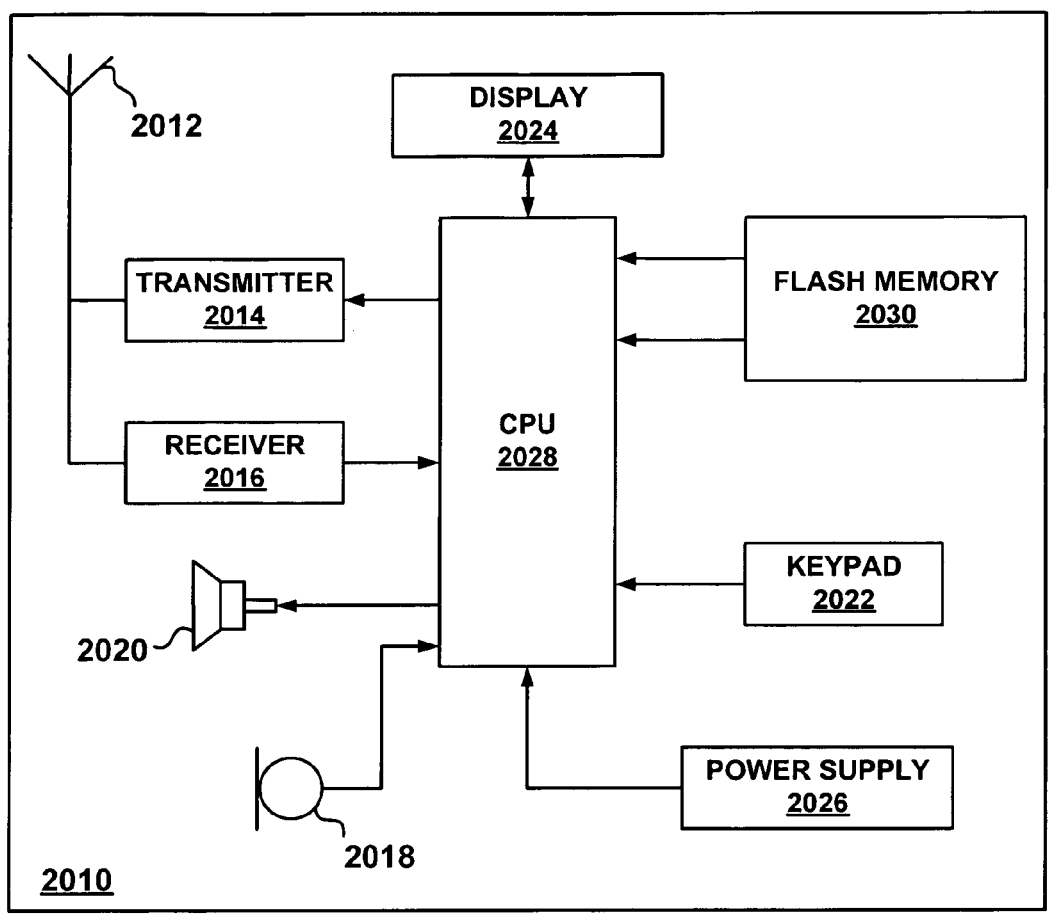
FIG. 9 is an illustration of a block diagram of an exemplary portable phone, upon which various embodiments of the invention may be implemented.

FIG. 9 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 can include a voltage detector circuit comprising a reference current generating section having one voltage-controlled current source which has a control terminal, a reference terminal and an output terminal and is configured to determine an output current of the output terminal according to a potential of the control terminal relative to the reference terminal, the control terminal receiving an input of a predetermined set potential, the reference terminal receiving an input of a reference potential, and the output terminal being coupled to a current input terminal of a current mirror circuit; and a detecting section having n number (n is a natural number) of voltage-controlled current sources.

Note that these elements of the flash memory 2030 can be implemented in any manner similar to that described herein, but is not limited to such. In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 10:
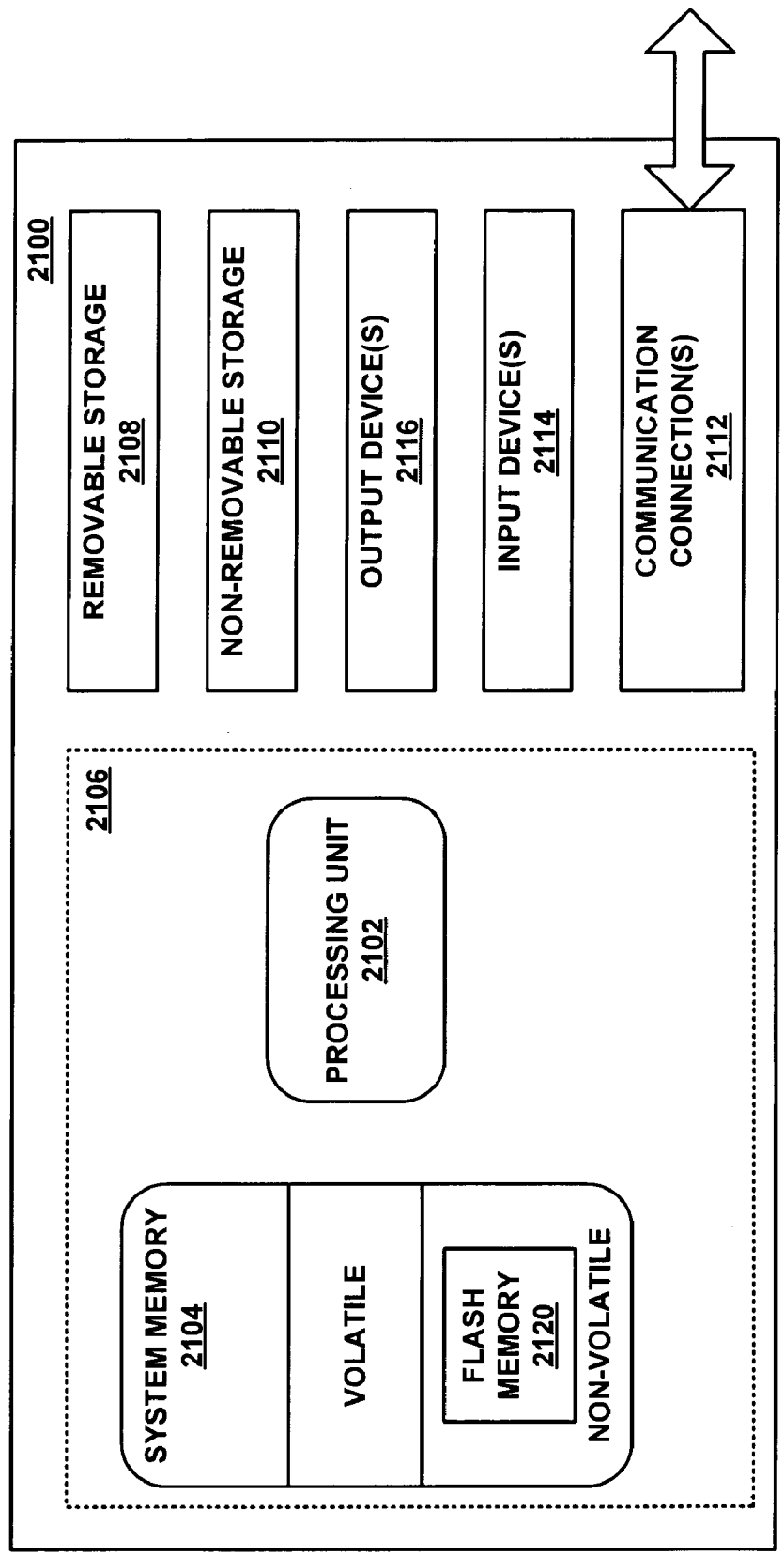
FIG. 10 is an illustration of a block diagram of an exemplary computing device, upon which various embodiments of the invention may be implemented.

FIG. 10 illustrates a block diagram of an exemplary computing device 2100, upon which various embodiments of the invention can be implemented. Although computing device 2100 is shown and described in FIG. 10 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 10.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 10 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 10 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 can include a voltage detector circuit comprising a reference current generating section having one voltage-controlled current source which has a control terminal, a reference terminal and an output terminal and is configured to determine an output current of the output terminal according to a potential of the control terminal relative to the reference terminal, the control terminal receiving an input of a predetermined set potential, the reference terminal receiving an input of a reference potential, and the output terminal being coupled to a current input terminal of a current mirror circuit; and a detecting section having n number (n is a natural number) of voltage-controlled current sources. Note that these elements of the flash memory 2120 can be implemented in any manner similar to that described herein, but is not limited to such. In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 11:
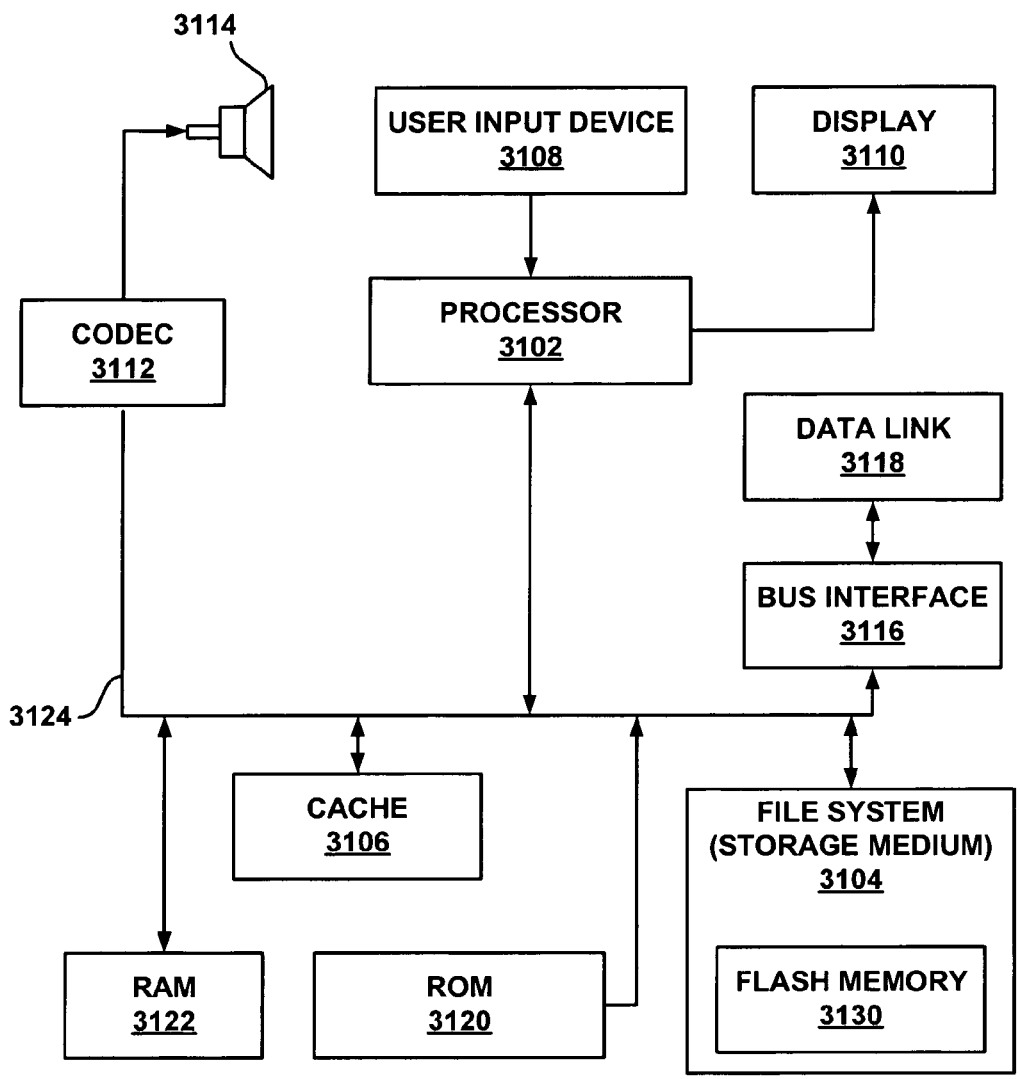
FIG. 11 is an illustration of a block diagram of an exemplary portable multimedia device, or media player, upon which various embodiments of the invention may be implemented.

FIG. 11 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 can include a voltage detector circuit comprising a reference current generating section having one voltage-controlled current source which has a control terminal, a reference terminal and an output terminal and is configured to determine an output current of the output terminal according to a potential of the control terminal relative to the reference terminal, the control terminal receiving an input of a predetermined set potential, the reference terminal receiving an input of a reference potential, and the output terminal being coupled to a current input terminal of a current mirror circuit; and a detecting section having n number (n is a natural number) of voltage-controlled current sources. Note that these elements of the flash memory 3130 can be implemented in any manner similar to that described herein, but is not limited to such. In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

The invention claimed is:

1. A voltage detector circuit comprising:
   a detecting section having n number (n is a natural number) of voltage-controlled current sources;
   a current mirror circuit; and
   a reference current generating section comprising:
     a voltage-controlled current source comprising:
       a control terminal;
       a reference terminal; and
       an output terminal,
   wherein the reference current generating section is configured to determine an output current of the output terminal according to a potential of the control terminal relative to the potential of reference terminal,
   wherein the control terminal of the voltage-controlled current source of the front circuit stage of the detecting section receives an input of a reference potential, and its output terminal is coupled to a current output terminal of the current mirror circuit through a first node,
   wherein the control terminal and output terminal of voltage-controlled current sources except for the voltage-controlled current source of the front circuit stage of the detecting section are commonly coupled to each other and coupled to the reference terminal of its associated preceding voltage-controlled current source, and wherein the reference terminal of the voltage-controlled current source of the last circuit stage of the detecting section receives an input of a potential to be detected.

2. The voltage detector circuit according to claim 1, wherein the voltage-controlled current sources have a first MOS transistor having a gate terminal coupled to the control terminal, a source terminal coupled to the reference terminal and a drain terminal coupled to the output terminal.

3. The voltage detector circuit according to claim 2, wherein the voltage-controlled current sources have at least one or more second MOS transistors inserted into a connection path between the reference terminal and the source terminal of the first MOS transistor, and
wherein said one or more second MOS transistors have a gate terminal commonly coupled to the gate terminal of the first MOS transistor.

4. The voltage detector circuit according to claim 3, wherein at least one of said one or more second MOS transistors of the voltage-controlled current source of the reference current generating section has a switch for bypassing said second MOS transistor; and
wherein at least one of said one or more second MOS transistors of at least one of the voltage-controlled power sources of the detecting section has a switch for bypassing said second MOS transistor.

5. The voltage detector circuit according to claim 3, further comprising:
a switch for adding the second MOS transistor coupled to the gate terminal of the first MOS transistor between the reference terminal of at least one of the voltage-controlled power sources of the detecting section and the source terminal of said one or more second MOS transistors coupled to the reference terminal.

6. The voltage detector circuit according to claim 1, further comprising:
a first driving circuit for driving the potential to be detected in a negative or positive direction; and
a second driving circuit for driving the potential to be detected in a direction opposite to the driving direction of the first driving circuit in accordance with increases in a detection current flowing in the detecting section.

7. The voltage detector circuit according to claim 6, wherein the second driving circuit has a third MOS transistor in which a gate terminal is coupled to the first node; a drain terminal is coupled to an output terminal of the first driving circuit; and a source terminal is coupled to a power supply potential if the driving direction of the first driving circuit is negative and coupled to the reference potential if the driving direction of the first driving circuit is positive.

8. The voltage detector circuit according to claim 7, wherein the driving direction of the first driving circuit is negative, and
wherein a P-channel MOS transistor for receiving an input of a first specified potential through its gate terminal is provided between the drain terminal of the third MOS transistor and the output terminal of the first driving circuit.

9. The voltage detector circuit according to claim 7, further comprising:
at least one capacitor coupled between the gate terminal of the third MOS transistor and the output terminal of the first driving circuit.

10. The voltage detector circuit according to claim 7, wherein the first driving circuit drives the potential to be detected in the negative direction, and
wherein the capacitor consists of a first capacitor one end of which is coupled to the gate terminal of the third MOS transistor and a second capacitor one end of which is coupled to the output terminal of the first driving circuit, the first and second capacitors being serially-coupled to each other,
the voltage detector circuit further comprising:
a diode having a cathode terminal coupled to a connection node between the first capacitor and the second capacitor and an anode terminal coupled to a second specified potential.

11. The voltage detector circuit according to claim 1, further comprising:
a voltage-controlled current source, the output terminal of which is coupled to the current output terminal of the current mirror circuit, the control terminal receives an input of the set potential and the reference terminal is coupled to the output terminal of the voltage-controlled current source of the front circuit stage of the detecting section.

12. The voltage detector circuit according to claim 1, further comprising:
the voltage-controlled current source being coupled between the current output terminal of the current mirror circuit and the detecting section,
wherein the control terminal receives an input of the set potential.

13. A method for detecting voltage generated from a voltage generation circuit with a voltage detector circuit, the voltage detector circuit including a current generating section and a detecting section, both sections including at least one voltage-controlled current source, the method comprising:
receiving as input a set potential and a ground potential;
generating an output current that serves as a reference current from the relative potentials of the set potential and the ground potential in a current mirror circuit;
receiving input of a voltage to be detected;
calculating the absolute value of a target potential of the voltage to be detected by multiplying the set potential by the number of voltage-controlled current sources in the detecting section;
balancing the reference current against the detection current by setting the voltages of each of the voltage-controlled current sources in the detecting section to become equal to the set potential when the absolute value of the voltage to be detected becomes equal to the target potential;
comparing the reference current output from the reference current generating section and the detection current flowing in the detecting section;
determining the existence of any deviation of the voltage to be detected from the reference current subsequent to the adjustment of the reference current; and
outputting the results of the determination from the first node.

14. The method according to claim 13, further comprising:
determining if the absolute value of the potential to be detected has increased by comparing the absolute value of the potential to be detected to the absolute value of the potential of the reference current;
increasing the current flowing in the detecting section by a value equal to the increase in absolute value of the potential to be detected in the event of an increase in the absolute value of the potential to be detected; and
adjusting the potential of the first node to correspond to a change in value of the potential to be detected.

15. The method according to claim 14, further comprising:

determining if the absolute value of the potential to, be detected has decreased by comparing the absolute value of the potential to be detected to the absolute value of the potential of the reference current;

decreasing the current flowing in the detecting section by a value equal to the decrease in absolute value of the potential to be detected in the event of a decrease in the absolute value of the potential to be detected; and adjusting the potential of the first node to correspond to a change in value of the potential to be detected.

16. The method according to claim 15, further comprising:
varying the target potential by adjusting the input set potential.

17. A system, comprising:
a processor;
a cache;
a user input component; and
a flash memory having a voltage generating circuit, the voltage generating circuit comprising:
   a detecting section having n number (n is a natural number) of voltage-controlled current sources;
   a current mirror circuit; and
   a reference current generating section comprising:
     a voltage-controlled current source comprising:
      a control terminal;
      a reference terminal; and
      an output terminal, wherein the reference current generating section is configured to determine an output current of the output terminal according to a potential of the control terminal relative to the reference terminal, wherein the control terminal of the voltage-controlled current source of the front circuit stage of the detecting section receives an input of the reference potential, and its output terminal is coupled to a current output terminal of the current mirror circuit through a first node, wherein the control terminal and output terminal of voltage-controlled current sources except for the voltage-controlled current source of the front circuit stage of the detecting section are commonly coupled to each other and coupled to the reference terminal of its associated preceding voltage-controlled current source, and wherein the reference terminal of the voltage-controlled current source of the last circuit stage of the detecting section receives an input of a potential to be detected.

18. The system as recited in claim 17 wherein the system is a portable media player.

19. The system as recited in claim 17 wherein the system is a cellular telephone.

20. The system as recited in claim 17 wherein the system is a computing device.

* * * * *